United States Patent

Sandera

[15] 3,685,141

[45] Aug. 22, 1972

[54] MICROALLOY EPITAXIAL VARACTOR

[72] Inventor: Jiri Sandera, Manhattan Beach, Calif.

[73] Assignee: TRW Inc., Lawndale, Calif.

[22] Filed: April 5, 1971

[21] Appl. No.: 131,065

[52] U.S. Cl. ......................29/576, 317/235, 148/187

[51] Int. Cl. ..............................................B01j 17/00

[58] Field of Search...29/576; 148/1.5, 187; 317/235

[56] References Cited

UNITED STATES PATENTS

| | | | |
|---|---|---|---|
| 2,972,092 | 2/1961 | Nelson | 317/235 |
| 3,082,127 | 3/1963 | Lee et al. | 148/1.5 |
| 3,382,115 | 5/1968 | Carter et al. | 148/187 |
| 3,592,705 | 7/1971 | Kawashima et al. | 317/187 |

*Primary Examiner*—James D. Kallam
*Attorney*—Spensley, Horn & Lubitz

[57] ABSTRACT

A high Q microalloy varactor having an abrupt PN junction and a Q in the order of 50–100 at 1 GHZ, and the following method for constructing the same. A shallow N type conductivity epitaxial region is deposited atop a low resistivity N + type conductivity parent wafer. A plurality of aluminum dots is provided over the N type conductivity region, and the structure is sintered at 700°C in an inert atmosphere to form, under each aluminum dot, a multiplicity of microscopic masses of P conductivity type. Thereafter, a portion of the epitaxial region is etched away to define a mesa structure. In a subsequent heating step a highly uniform P growth region is formed beneath each aluminum dot by the process of alloy regrowth, thereby forming an abrupt PN junction. Additional etching, heating, passivation, annealing, and dicing steps are all carried out.

16 Claims, 11 Drawing Figures

JIRI SANDERA
INVENTOR

BY Spensley, Horn, & Lubitz
ATTORNEYS

JIRI SANDERA
INVENTOR.

BY Spensley, Horn & Lubitz
ATTORNEYS

MICROALLOY EPITAXIAL VARACTOR

BACKGROUND OF THE INVENTION

1. Field of the Invention

This invention relates to varactors and more particularly to an improved method and construction of a microalloy varactor having a high Q at high frequencies and abrupt PN junction in a shallow epitaxial region.

2. Prior Art

It has heretofore been known how to produce PN junction varactors by either diffusing or alloying the junction.

Junctions formed by alloying are characterized in the art as "abrupt" junctions due to the step change in the doping levels across their junctions. One significant characteristic of a varactor having an abrupt junction is that it provides a large change in capacitance for a given change in bias voltage, a change larger than that obtainable in a diffused junction device. It is well known that the capacitance, C, of an abrupt junction varactor is proportional to the bias voltage, V, raised to the $-\frac{1}{2}$ power; i.e. $C=k$, $V^{-1/2}$, $k$, being a constant, whereas for a diffused junction varactor, $C= k_2V^{-1/3}$, $k_2$ being a constant. Since an abrupt junction cannot readily be produced by diffusion, varactors having alloy junctions have generally been preferred over those having diffused junctions.

Another characteristic desired in varactors is a high Q at high frequencies. However, for the reasons discussed hereinbelow, the methods of the prior art have been unable to produce alloy junction varactors having a high Q. On the other hand, the prior art does teach the production of diffused junction varactors having high Q values. However, resorting to the diffused junction in order to obtain a high Q necessarily precludes having the desirable abrupt junction characteristics associated with the alloy junction, namely, the $-\frac{1}{2}$ law governing the capacitance-bias voltage function. In the so-called "hyper-abrupt" varactor, even greater sensitivity of capacitance to voltage bias change is attainable than that provided by an abrupt junction. This sensitivity is achieved by diffusing the proper doping distribution into the epitaxial region before the junction is formed. However, the Q obtainable in hyper-abrupt devices produced by the methods of the prior art is relatively low. Thus, heretofore one had to choose between having a high Q or having high sensitivity of capacitance to voltage bias change. However, the present invention, for the first time, makes possible the attainment of both a high Q and the capacitance-bias voltage characteristic of an abrupt junction in the same varactor.

In PN alloy junction varactors the uniformity of the P regrowth region of the PN junction is of critical importance in achieving high Q values. The Q of a varactor, at any given frequency, is inversely proportional to its series resistance (the latter consisting of the sum of the volume epitaxial resistance and the unswept region resistance). As the thickness of the epitaxial region increases, the series resistance likewise increases, thereby causing a proportionate decrease of the Q. If the P regrowth region is irregular, i.e., if it has protrusions and/or spikes extending far into the N conductivity type epitaxial region, the epitaxial region must of necessity be made thick enough to prevent base punch through and to maintain a reasonable voltage breakdown characteristic. As stated above, the greater the thickness of the epitaxial region, the less the value of Q. A high Q, therefore, can be attained if the PN junction can be grown in a shallow epitaxial region. To do this without substantially reducing the voltage breakdown characteristic of the device and without the risk of base punch through requires that the P regrowth region be highly uniform. Thus, for this reason the achievement of a high Q PN alloy junction varactor is directly and critically related to the ability to produce a uniform P regrowth region.

The methods of the prior art have failed to produce highly uniform P regrowth regions. In the prior art excessive alloy regrowth takes place due to randomly distributed high energy points within the alloy, surface tension, and the tendency of the regrowth region to "-boil up". This results in P region protrusions and/or spikes extending far into the N conductivity type epitaxial region. If the epitaxial region is shallow, a substantial decrease of the voltage breakdown characteristic of the device occurs. In the worst case a spike may punch through the epitaxial region to the base material, rendering the device inoperative.

In order to avoid these consequences, varactors produced by the methods of the prior art have been relatively large devices having thick epitaxial regions. In this way the effects of the non-uniformity of the P regrowth region, i.e., the effects of its protrusions and spikes are mitigated. However, as pointed out above, this means of overcoming this limitation of the prior art comes at the expense of achieving high Q values.

The present invention overcomes this shortcoming of the prior art by disclosing a novel method for producing an abrupt PN alloy junction having a highly uniform P regrowth region in a shallow epitaxial region. This is achieved by the introduction of the novel step of sintering the semi-conductor structure before starting the alloy regrowth step. During this sintering process a multiplicity of uniformly distributed microscopic P conductivity type masses forms between the epitaxial region and a metal layer, typically aluminum, disposed thereon. No alloy regrowth is allowed to take place during sintering because it would, as in the pior art, be non-uniform. In order to prevent alloy regrowth at this time, the sintering step is carried out at a temperature below that which is required for alloy regrowth.

During the subsequent alloy regrowth step, each of the microscopic P conductivity type masses acts as an alloy growth center. Since these microscopic masses are uniformly distributed and since they grow at approximately the same rate, highly uniform alloy regrowth is achieved. The uniformity of the resulting P regrowth region allows the junction to be grown in a shallow epitaxial region thereby increasing the Q of the devices to a level heretofore not attainable in alloy junction devices. In the present invention the epitaxial region may be as shallow as possible within the following constraint, to wit: that the epitaxial region be thick enough and have a sufficient resistivity to support the maximum voltage to be applied across it.

The inability of the prior art to control alloy regrowth and thereby to achieve uniform P regrowth regions has resulted in the production of large junction devices having large epitaxial regions in order to mitigate the detrimental effects of the non-uniform P regrowth regions. These large devices have capacitance values of the order of 100 pf and Q's substantially below 50 at 1 GHZ. The present invention now makes possible the production of microalloy varactors having capacitances up to 10 pf and Q's of the order of 50–100 at 1 GHZ.

It is also believed that the new art herein disclosed for achieving highly uniform P regrowth regions may be advantageously applied to the production of improved hyper-abrupt junction varactors. In the prior art hyper-abrupt junction varactors have been produced by diffusing the proper doping distribution into the epitaxial region, after which the junction is formed. Due to the inability to control alloy regrowth and the irregular P regrowth regions which result, the junctions of such hyper-abrupt devices have not been formed by alloying, but instead by diffusion. However, the temperatures required for diffusion of the junctions (1100°–1200°C) are the same as those required during the earlier diffusion of dopants into the epitaxial region. As a consequence, the doping distribution built into the epitaxial region is disturbed and the desired sensitivity of capacitance to bias voltage change is adversely affected. On the other hand, the forming of junctions by alloying takes place at temperatures which would not disturb the doping distribution in the epitaxial region (around 850°C). As pointed out above the junctions of hyper-abrupt junction varactors have heretofore not been formed by alloying because of the poor control of alloy regrowth. However, the method disclosed by the present invention now makes feasible the use of alloy junctions in such varactors, thereby avoiding the detrimental disturbance of the epitaxial doping distribution associated with the diffused junction.

It is further believed that the method taught by the present invention may be advantageously applied to other semiconductor devices, e.g., a PNP transistor, by making possible the use of alloy junctions in applications which could not heretofore use alloying because of the poor control of the growth of the P regrowth region. The advantage of such a use of the present invention lies in the lower temperature required to form the alloy junction and, therefore, in the reduced disturbance of the doping distributions of other junctions.

The present invention also teaches the forming of a mesa structure by etching the epitaxial region after the sintering step but before alloy regrowth. This further promotes uniform alloy regrowth by substantially reducing the amount of epitaxial material, typically silicon, which is drawn into the P regrowth region from the sides, a phenomenon which contributes to non-uniform alloy regrowth. In the prior art, etching of the mesa is done after the growing of the P regrowth region, not before as disclosed herein.

The mesa structure of the present invention has the further advantage of substantially preventing the buildup of high surface electric fields. These surface fields can cause voltage breakdown at the surface of the device at voltages below the level which the device could otherwise support across its epitaxial region. Thus, the elimination of high surface fields enables the device to be used through its full voltage range limited only by the voltage breakdown characteristic of its epitaxial region below the junction.

Varactors produced by the method of the present invention also exhibit certain improved operating characteristics relative to varactors made by the prior art. These improvements are achieved by a novel second heating step subsequent to the step of alloying the junction. The improved characteristics include (i) a lower back current; (ii) minimum noise; (iii) better regulation; (iv) a cleaner breakdown region; and (v) a sharper breakdown knee.

The second heating step disclosed herein has the additional advantage of smoothing out the P regrowth region by promoting some further P regrowth. Although such further P regrowth tends to decrease the thickness of the epitaxial region, below the junction, there is only a minimal decrease in the voltage breakdown level, a decrease far outweighed by the improvements outlined hereinabove.

BRIEF SUMMARY OF THE INVENTION

The present invention is a new and improved construction of a high Q, high frequency, microalloy epitaxial varactor and a method for making the same. Its abrupt PN alloy junction has a highly uniform P regrowth region in a shallow N conductivity type epitaxial region. Among its salient characteristics are;

1. Q in the range of 50 to 100 at a frequency of 1 GHZ;
2. capacitances proportional to the bias voltage raised to the $-\frac{1}{2}$ power;
3. capacitances up to 10 pf;
4. voltage breakdown characteristics having a cleaner breakdown region and a sharper breakdown knee;
5. micromesa structure;
6. low back current, in the order of picoamperes at 10 volts;
7. minimum noise; and
8. better regulation.

The construction of the present invention is best described by disclosing the method for its production. A shallow N conductivity type region, e.g., silicon, is epitaxially deposited atop a low resistivity N+ conductivity type parent wafer. The parent wafer and the epitaxial region are typically doped by methods known in the art to achieve particularly desired characteristics. A thin layer of metal, e.g., aluminum, is then evaporated over the entire top surface of the epitaxial region. Photo-resistant techniques are utilized to produce a plurality of small aluminum dots from the thin layer of aluminum. The semiconductor structure is then sintered in an inert atmosphere, e.g., nitrogen, forming, thereby, a multiplicity of uniformly distributed microscopic P conductivity type masses between the bottom surface of each aluminum dot and the upper portion of the epitaxial region. The sintering temperature is maintained below that which is required for alloy regrowth and, therefore, no alloy regrowth occurs during sintering. The prevention of alloy regrowth during sintering is required because any P regrowth at this time would be non-uniform due to high energy points within the regrowth region, surface tension, and the tendency of the regrowth region to "boil up".

Following sintering a portion of the epitaxial region in the space between the aluminum dots is etched using the aluminum dots as masks. By this etching process a plurality of micromesa structures is defined. The mesa structure has the advantage of promoting uniform alloy regrowth and of preventing the buildup of high surface fields on the finished varactor during operation.

The entire structure is then heated in an inert atmosphere, typically nitrogen, followed by a period of cooling in the same atmosphere and then an air quench to room temperature. During this first heating step each of the microscopic P conductivity type masses acts as an alloy growth center. Since these microscopic masses are uniformly distributed and since they grow at approximately the same rate, a highly uniform P regrowth region is formed in the shallow epitaxial region below the aluminum dots. In addition, during this heating step the aluminum dots become aluminum-silicon eutectics.

After forming the junction, at least one additional etching step is required in order (i) to relieve the junction, (ii) to prepare its surface for passivation, and (iii) to achieve the desired capacitance of the junction at reasonable levels of back voltage. Relieving the junction reduces the back current of the finished device. During the etching of the epitaxial region between the dots, however, some of the P regrowth region and some of the epitaxial region beneath the dots are also etched away causing the dots to overhang these lower regions. This overhang of the dots of aluminum eutectic is removed by exposure of the structure to an etching fluid, e.g., hydrogen fluoride and/or ultra-sonic vibration.

A second heating step follows in an inert atmosphere, typically nitrogen. This second heating smooths out the P regrowth regions, improves the voltage breakdown characteristic, lowers the back current, and reduces the noise level of the devices.

Next, the surface of the structure is passivated and terminals are connected to each junction. The structure is then processed by techniques known in the art to yield single or multiple junction varactors. Interconnection of multiple junctions provides higher capacitance without an adverse effect on the value of Q. In fact, an increase in Q may result.

Thus, it is a principal objective of this invention to provide a method for producing a highly uniform P conductivity type regrowth region.

It is another principal object of this invention to provide a microalloy varactor having an abrupt PN junction in a shallow epitaxial region, and a method for making the same.

It is a further objective of this invention to provide an alloy junction varactor with a micromesa structure, and a method for making the same.

It is a still further objective of this invention to provide a microalloy varactor having a high Q at high frequencies, and a method for making the same.

It is another object of this invention to provide an improved alloy junction varactor having low back current, minimum noise, and better regulation and a method for making the same.

It is still another object of this invention to provide an alloy junction varactor having an improved voltage breakdown characteristic and a method for making the same.

A still further object of this invention is to provide an alloy junction varactor diode having stable surface conditions.

The novel features which are characteristic of the present invention, as well as other objects and advantages thereof, will be better understood from the following description, reference being had to the accompanying drawings in which a presently preferred embodiment of the invention is illustrated by example.

DETAILED DESCRIPTION OF THE INVENTION

Referring to FIGS. 1–11 a preferred method and embodiment of the present invention will now be described in detail.

Figure 1:
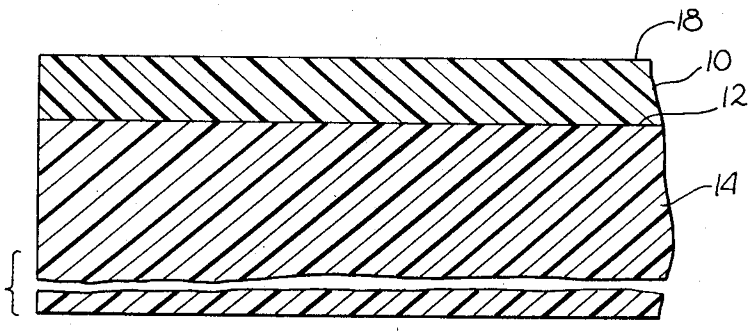
FIG. 1 is a cross-sectional view of a semiconductor structure depicting a shallow epitaxial region atop a parent wafer.

A first step of the preferred method is to epitaxially grow a shallow, N conductivity type region 10 upon the top surface 12 of a low resistivity, N + conductivity type parent wafer 14. The resultant structure is depicted in FIG. 1. The epitaxial region 10 is typically a doped silicon having a thickness and a resistivity sufficient to support the maximum voltage to be applied across it. In this preferred embodiment the epitaxial region 10 is 6 to 8 microns in thickness and has a resistivity from 0.5 to 1.4 ohm-centimeters. It should be understood that in other embodiments of the present invention even thinner epitaxial regions 10 can be utilized by virtue of the method disclosed for achieving highly uniform growth of the P regrowth region 26. The minimum thickness of the epitaxial region 10 is not constrained to being at least that thickness which heretofore was required to safeguard against base punch through.

For the parent wafer 14 an arsenic doped monocrystalline planar piece of silicon is preferred, having a polished surface 12 and a resistivity of the order of 0.001 ohm-centimeters. The thickness of the parent wafer 14 is approximately 10 mils. The epitaxial growth of the silicon region 10 upon the parent wafer 14 is accomplished by techniques which are known in the art and, therefore, are not disclosed.

Figure 2:
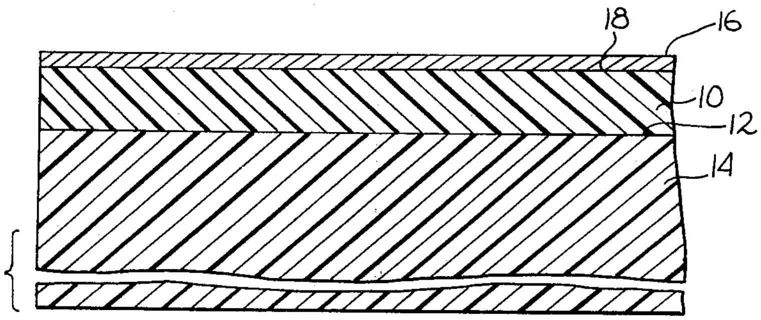
FIG. 2 is the cross-sectional view of FIG. 1 after a thin layer of aluminum is deposited over the top surface of the epitaxial region.

A second step involves the evaporation of a thin layer of metal 16, preferably aluminum, upon the entire top surface 18 of the epitaxial region 10. The resultant structure is depicted in FIG. 2. The thickness of the aluminum layer is from 2 to 3 microns. The techniques for evaporating aluminum onto a surface and for controlling its thickness thereon are known in the art.

Figure 3:
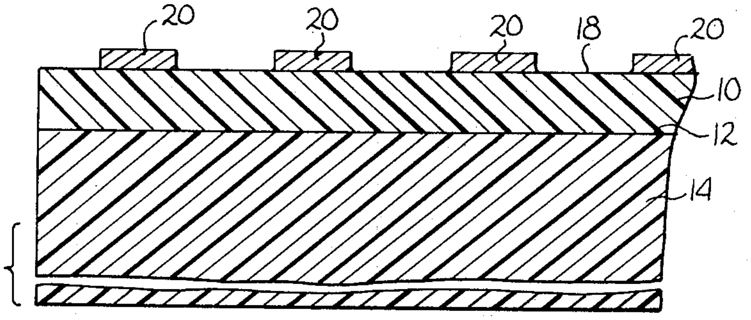
FIG. 3 is the cross-sectional view of FIG. 2 after a masked portion of the aluminum layer is removed so as to form a plurality of aluminum dots.
Figure 4:
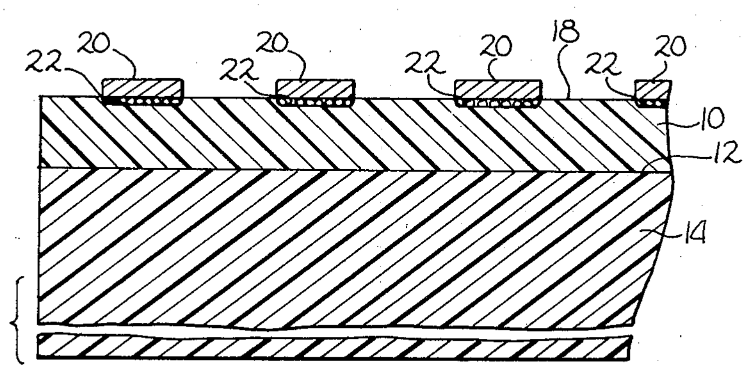
FIG. 4 is the cross-sectional view of FIG. 3 after the semiconductor structure is sintered.

A third step employs conventional photo-resistant techniques to produce a plurality of aluminum dots 20 from the original aluminum layer 16 as shown in FIG. 3. The dots 20 can be from 3 mils to 15 mils in diameter depending upon the particular characteristics desired.

In a fourth step the entire semiconductor structure shown in FIG. 3 is sintered in an inert atmosphere, typically nitrogen, at a temperature in the range from 690°C to 710°C (nominally 700°C) for a duration of 30 ± 5 minutes. During sintering a multiplicity of uniformly distributed microscopic P conductivity type masses 22 form between the bottom surface of each aluminum dot 20 and the upper portion of the epitaxial region 10. Alloy regrowth is not desirable during this sintering step because P regrowth at this time would be non-uniform due to high energy points randomly distributed within the regrowth region, surface tension and the tendency of the regrowth region to "boil up". In order to prevent alloy regrowth the sintering is done at a temperature (700°C) which is below that required for alloy regrowth.

Figure 5:
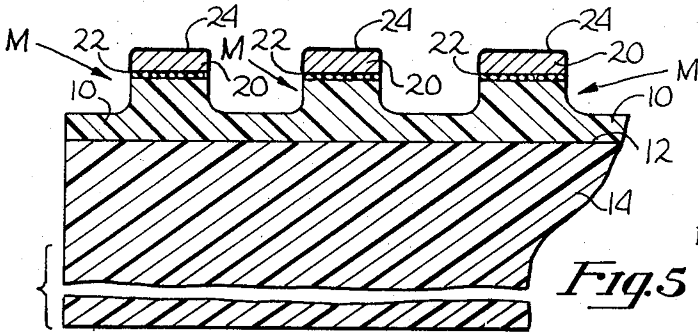
FIG. 5 is the cross-sectional view of FIG. 4 after a first etching of a portion of the epitaxial region between the aluminum dots.

In a fifth step of the preferred method approximately 5 microns of the epitaxial region 10 is etched away in the space between the aluminum dots 20, thereby forming the micromesas M shown in FIG. 5. The aluminum dots 20 serve as masks during the etching step. A thin film of aluminum oxide 24 forms over the aluminum dots 20 and prevents etching of the aluminum itself. However, agitation of the structure must be avoided during etching in order to prevent the aluminum oxide film 24 from being dislodged and, thereby, exposing the aluminum dots 20 directly to the etching fluid. The preferred etching fluid consists of 1–2 parts HF to 5–15 parts $HNO_3$ to 2–5 parts glacial acetic acid. The mesa structure promotes uniform alloy regrowth and prevents the buildup of high surface fields during operation of the varactor.

In a sixth step the semiconductor structure of FIG. 5 is heated at a temperature of 845°C to 855°C (nominally 850°C) in a furnace having an inert atmosphere, preferably nitrogen, for 15 ± 5 minutes. During this heating step each of the microscopic P conductivity type masses 22 acts as an alloy growth center. These masses 22 are uniformly distributed under each aluminum dot 20 and they grow at approximately the same rate. Consequently, highly uniform P regrowth regions 26, 2 to 3 microns in thickness, are grown in the shallow N conductivity type epitaxial regions 10 below each aluminum dot 20, forming , thereby, abrupt PN alloy junctions 28. Thus, in this preferred embodiment the thickness of the epitaxial regions 10 remaining beneath the junction 28 after the growth of the P regions 26 is 3 – 6 microns. In other embodiments P regrowth regions 26 can be grown in even thinner epitaxial regions 10 than the 6–8 microns disclosed in this preferred embodiment, thereby achieving even higher Q values. An additional consequence of this heating step is the changing of the aluminum dots 20 into dots of aluminum-silicon eutectic 20'. After the 15 minutes of heating described hereinabove, the entire semiconductor structure depicted in FIG. 6 is placed in a nitrogen atmosphere at a temperature of 395°C to 405°C (nominally 400°C) for approximately 3 minutes, after which it is removed for an air quench at room temperature.

In a seventh step the structure of FIG. 6 is again etched without agitation using the dots of aluminum-silicon eutectic 20' as a mask. This second etching step removes much of the remaining epitaxial material 10 between the micromesas M. In this manner the micromesas M are further defined and delineated. The preferred etching fluid is again 1–2 parts HF to 5–15 parts $HNO_3$ to 2–5 parts glacial acetic acid. The thin aluminum oxide film 24 covering the dots of aluminum-silicon eutectic 20' keeps the latter from being etched by the fluid. This second etching step relieves the junction 28, thereby reducing the back current of the finished device. It also prepares the surfaces around the junction 28 for passivation and trims the junction 28 so as to achieve the desired capacitance at reasonable levels of back voltage.

Figure 7:
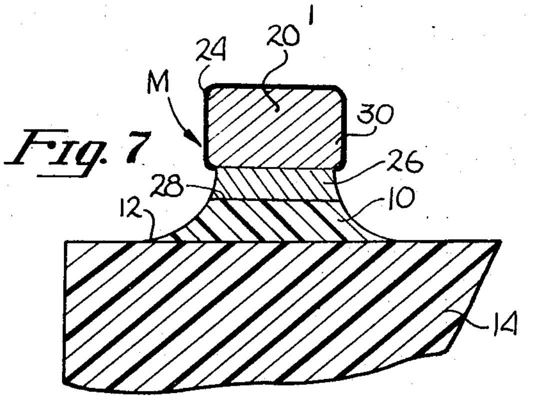
FIG. 7 is the cross-sectional view of one of the mesa structures of FIG. 6 after the further etching of the epitaxial region between the aluminum dots.

In an eighth step of the preferred method of this invention the structure depicted in FIG. 7 is heated for a second time in an inert atmosphere, typically nitrogen, at a temperature of 895°C to 905°C (nominally 900°C) for 15 ± 5 minutes. This is followed by a cooling of the structure in a nitrogen atmosphere at temperatures of 400°C to 450°C for 3 ± 1 minute, and then removal for an air quench at room temperature. This second heating step causes a further smoothing out of the P regrowth regions 26 and, in addition, it improves the voltage breakdown characteristic, lowers the back current of each varactor produced, and reduces the noise level of the devices.

Figure 6:
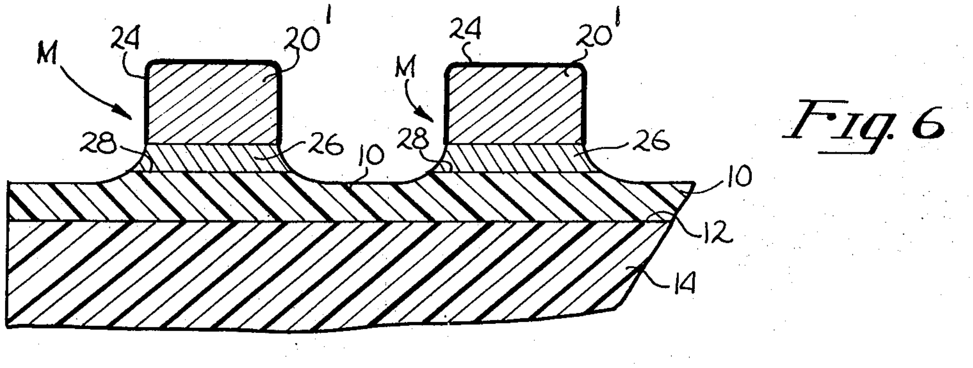
FIG. 6 is the cross-sectional view of FIG. 5 depicting the alloy junctions formed after heating of the semiconductor structure.

In a ninth step the structure of FIG. 6 is etched for the third time without agitation using the dots of aluminum-silicon eutectic 20' as a mask. This etching removes additional epitaxial material 10 between the micromesas M down to the top surface 12 of the parent wafer, further delineating the micromesas M. The preferred etching fluid is again 1–2 parts HF to 5–15 parts $MNO_3$ to 2–5 parts glacial acetic acid. As in the prior etching steps, the thin film of aluminum oxide 24 keeps the aluminum-silicon eutectic 20' from being etched by the fluid. Etching is complete when the back current is sufficiently reduced, the surfaces around the junction 28 are prepared for passivation, and the desired capacitance, at a reasonable level of back voltage, is achieved; thus, additional etching steps may be required. On the other hand, it should be understood that although the preferred method described herein discloses two or more etching steps after the formation of the junction 28, other methods of practicing the present invention, which utilize only one etching step after forming the junction 28, are within the scope and contemplation of the present invention. Etching steps after the formation of the junction 28 are of course in addition to the novel step of etching before forming the junction 28.

During the etching of the epitaxial region 10 between the micromesas M, some of the P regrowth region 26 and some of the epitaxial region 10 beneath the aluminum-silicon dots 20′ (along the vertical walls of the micromesas M) are also etched away. This results in the appearance of overhangs 30 of the outer portions of the dots of aluminum-silicon eutectic 20′ as shown in FIG. 7. In a tenth step the overhangs 30 are removed by exposing the structure of FIG. 7 to an etching fluid, e.g., HF and/or an ultra-sonic vibration of sufficient frequency and energy to knock the overhangs 30 off the micromesas M.

Figure 8:
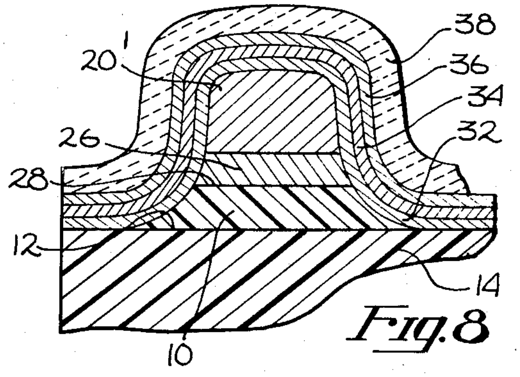
FIG. 8 is the cross-sectional view of FIG. 7 after the passivation of the structure.

In an eleventh step the surfaces of the micromesas M are passivated. A preferred method of passivation is by the reactive sputtering of three layers 32, 34 and 36 of silicon dioxide, a silicon oxynitride, and silicon dioxide respectively, in accordance with the teachings disclosed in my co-pending application "Improved Passivation Method For Silicon Peripheral Junction Die Having Intimate Contact With Package Glass", Ser. No. 51,948, filed on July 2, 1970. The resulting construction is depicted in FIG. 8. Preferred thickness of each of the layers 32, 34, and 36 is approximately 6,000 angstroms.

A twelfth step involves the deposition of a layer of glass 38 having a thickness of 2 to 6 microns over the semiconductor structure as shown in FIG. 8. This is accomplished by conventionally centrifuging a colloidal solution of powdered glass followed by the fusion of the glass layer 38 to the upper surface of the silicon dioxide layer 36 by heating at a temperature of approximately 550°C. The use of the glass layer 38 is optional in the preferred method; however, its use is not preferred for small (low capacitance) varactors because it adds stray capacitance of approximately 1 pf.

Figure 9:
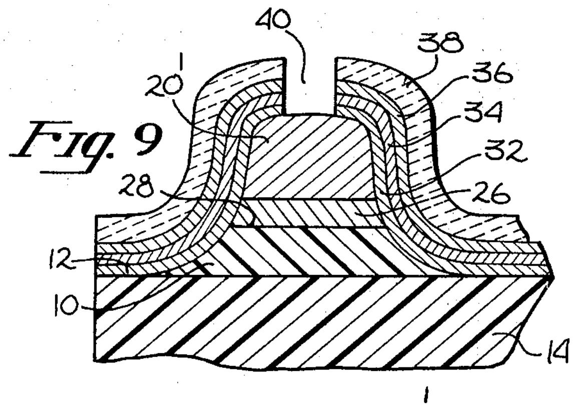
FIG. 9 is the cross-sectional view of FIG. 8 after a hole has been cut in the passivating materials.

FIG. 9 shows a hole 40 cut into the layers 32, 34, 36 and 38 by the use of a HF-glycol solution at room temperature (or by the use of any other known techniques). The hole 40 enables a terminal to be installed making electrical contact with the junction 28.

Figure 10:
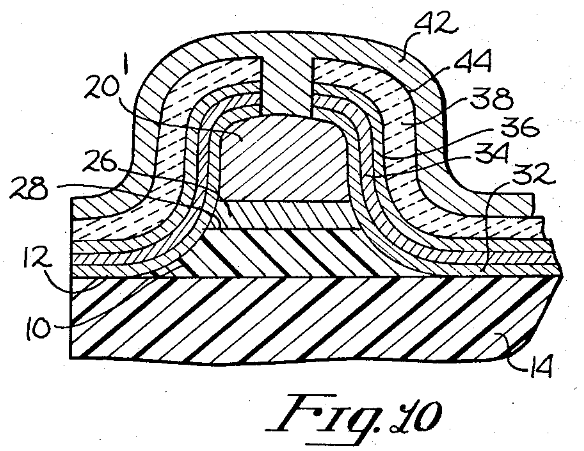
FIG. 10 is the cross-sectional view of FIG. 9 after aluminum has been evaporated over the entire surface of the mesa structure and into the hole.
Figure 11:
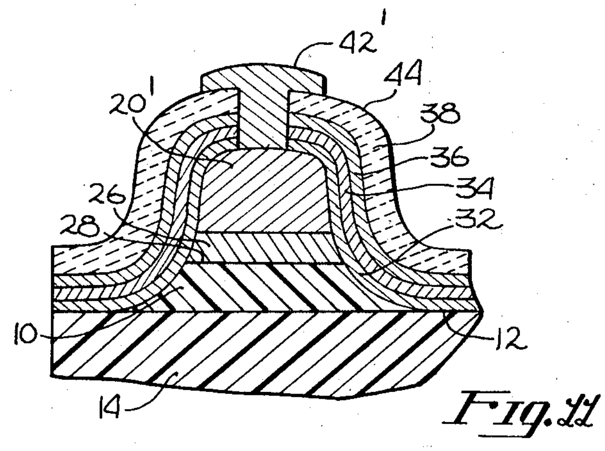
FIG. 11 is the cross-sectional view of FIG. 10 after the outer layer of aluminum has been etched away at all places except in the vicinity of the hole.

If a glass layer 38 is used, a terminal 42′ may be installed by conventionally evaporating a layer of aluminum 42 over the entire top surface 44 of the glass 38 and into the hole 40 as shown in FIG. 10. The preferred thickness of the aluminum layer 42 over the surface 44 is approximately 3 microns. The aluminum layer 42 is then etched away by conventional means except in the vicinity of the hole 40, leaving, thereby, an electrical contact 42′ as shown in FIG. 11. (If the glass layer 38 is not used, then a terminal 42′ can be installed by the conventional use of thermal-compression bonded wire after the structure is diced).

The semiconductor structure shown in FIG. 11 is then annealed in an inert atmosphere, preferably nitrogen, at a temperature of 598°C to 602°C (nominally 600°C) for 5 ± ½ minutes. It is then cooled in a nitrogen atmosphere at a temperature of 400°C to 450°C for 5 ± 2 minutes, after which it is quenched in air at room temperature.

Following annealing the parent wafer 14, having on its upper surface a plurality of the structures shown in FIG. 11 is processed by methods known in the art to produce a plurality of single or multiple junction varactors. The conventional methods referred to hereinabove include lapping the bottom of the parent wafer 14 to approximately a thickness of 5 mils; evaporating gold on the bottom side of the parent wafer 14; sintering at approximately 400°C in nitrogen; scribing, dicing; and scrubbing to form ohmic contacts on the gold side of each varactor. The scribing and dicing of the parent wafer 14 can be done so as to yield multiple junction devices whose junctions are then interconnected to provide higher capacitance without adversely affecting the Q value.

In another embodiment of the present invention a hyper-abrupt junction varactor may be produced by diffusing the proper doping distribution into the epitaxial region before forming the alloy junction. The forming of the alloy junction by the method disclosed hereinabove occurs at temperatures which do not adversely affect the doping distribution built into the epitaxial region and, therefore, do not disturb the hyper-abrupt characteristic of the junction.

Although this invention has been disclosed and described with reference to a particular embodiment, the principles involved are susceptible of other applications which will be apparent to persons skilled in the art. This invention, therefore, is not intended to be limited to the particular embodiment herein disclosed.

I claim:

1. A method of making a semiconductor device comprising the steps of:

a. providing a semiconductor body having first and second layered regions of the same conductivity type, said second region being atop of said first region and having a higher resistivity than said first region;

b. depositing a layer of an electrically conducting third region over the top surface of said second region;

c. removing a portion of said third region and thereby leaving a plurality of separate zones of said third region;

d. sintering said semiconductor body in an inert atmosphere and thereby causing the formation of a plurality of microscopic masses of a conductivity type different than that of said semiconductor body between said second region and each of said zones of said third region;

e. removing a portion of said second region in the space between said zones of said third region and thereby causing said zones of said third region and the portions of said second region beneath them to define a plurality of mesas;

f. providing a first heating of said semiconductor body in an inert atmosphere and thereby forming fourth layered regions between said second region and each of said zones of said third region, each of said fourth regions being of a different conductivity type than said second region and having a substantially uniform thickness;

g. providing a first cooling of said semiconductor body in an inert atmosphere;

h. providing a second heating of said semiconductor body in an inert atmosphere;

i. providing a second cooling of said semiconductor body in an inert atmosphere;

j. removing those portions of said zones of said third region which extend beyond the edges of said fourth and said second regions;

k. passivating the top surface of said semiconductor body, including the exposed surfaces of said first, second, third and fourth regions, by covering said surfaces with at least one layer of passivating material, said layer of passivating material defining an opening therein so as to leave exposed a portion of said third region;

l. providing an electrically conducting terminal in contact with each of said zones of said third region;

m. annealing said semiconductor body in an inert atmosphere;

n. depositing an electrically conducting material onto the bottom surface of said first region; and o. dicing said semiconductor body to form separate devices, each of said devices having at least one of said mesas.

2. The method of claim 1 wherein said sintering is in a nitrogen atmosphere at a temperature in the range from 690°C to 710°C for a duration of 30± 5 minutes.

3. The method of claim 1 wherein said portion of said second region is removed by etching in at least one step before said first heating and in at least one step after said first heating, said zones of said third region serving as masks and said etching being accomplished with negligible agitation of said semiconductor body.

4. The method of claim 3 wherein said etching fluid comprises 1–2 parts HF to 5–15 parts $HNO_3$ to 2–5 parts glacial acetic acid.

5. The method of claim 1 wherein said first heating of said semiconductor body is in a nitrogen atmosphere at a temperature in the range from 845°C to 855°C for a duration of 15 ± 5 minutes.

6. The method of claim 1 wherein said first cooling of said semiconductor body is in a nitrogen atmosphere at a temperature in the range from 395°C to 405°C for a duration of approximately 3 minutes, followed by an air quench at room temperature.

7. The method of claim 1 wherein said portions of said third region which extend beyond the edges of said fourth and second regions are removed by etching with HF.

8. The method of claim 1 wherein said portions of said third region which extend beyond the edges of said fourth and second regions are removed by exposing said semiconductor body to ultra-sonic vibration.

9. The method of claim 1 wherein said second heating of said semiconductor body is in a nitrogen atmosphere at a temperature in the range from 895°C to 905°C for a duration of 15 ± 5 minutes.

10. The method of claim 1 wherein said second cooling of said semiconductor body is in a nitrogen atmosphere at a temperature in the range from 400°C to b450°C for a duration of approximately 3 ± 1 minutes, followed by an air quench at room temperature.

11. The method of claim 1 wherein the surface of said semiconductor body is passivated by reactively sputtering three layers of passivating material thereon.

12. The method of claim 11 including the further step of centrifugally depositing over said third layer of passivating material a layer of glass from out of a colloidal solution of powdered glass, said layer of glass then being fused to said third layer of passivating material by heating at a temperature of approximately 550°C.

13. The method of claim 12 including the further step of exposing a portion of the top surface of each of said zones of said third region by removing a portion of each of said layers of passivating material and a portion of said layer of glass directly above said top surfaces of said zones by masking and etching with a HF-glycol solution.

14. The method of claim 13 wherein said electrically conducting terminals in contact with the top surfaces of said zones of said third region are provided by first evaporating a layer of an electrically conducting metal onto said top surfaces and onto said layer of glass, followed by the etching away of substantially all of said layer of metal not directly above said top surfaces.

15. The method of claim 1 wherein said semiconductor body is annealed by first heating in a nitrogen atmosphere at a temperature in the range of from 598°C to 602°C for a duration of 5 ± ½ minutes, followed by cooling in a nitrogen atmosphere at a temperature in the range from 400°C to 450°C for a duration of 5 ± 2 minutes and an air quench at room temperature.

16. A method of making a semiconductor varactor comprising the steps of:

a. providing a semiconductor body having first and second layered regions of N + and N conductivity types, respectively, said second region being epitaxially grown atop said first region and having a higher resistivity than said first region;

b. depositing a third region onto the top surface of said second region by evaporating a layer of metal thereon;

c. removing a portion of said third region by photoresistant techniques and thereby leaving a plurality of separate zones of said third region;

d. sintering said semiconductor body in a nitrogen atmosphere at a temperature in the range from 690°C to 710°C for a duration of 30 ± 5 minutes and thereby causing the formation of a plurality of microscopic masses of P conductivity type between said second region and said zones of said third region;

e. removing a first portion of said second region to a depth of approximately 5 microns in the space between said zones of said third region by etching with a fluid comprising 1–2 parts HF to 5–15 parts $HNO_3$ to 2–5 parts glacial acetic acid with negligible agitation of said semiconductor body, said zones of said third region serving as masks and thereby causing said zones of said third region and the portions of said second region beneath them to define a plurality of mesas;

f. providing a first heating of said semiconductor body in a nitrogen atmosphere at a temperature in the range from 845°C to 855°C for a duration of 15 ± 5 minutes and thereby forming fourth layered regions between said second region and each of said zones of said third region, each of said fourth regions being of P conductivity type and having a substantially uniform thickness;

g. providing a first cooling of said semiconductor body in a nitrogen atmosphere at a temperature in the range from 395°to 855°C for a duration of approximately 3 minutes, followed by an air quench at room temperature;

h. removing a second portion of said second region in the space between said zones of said third region by etching with a fluid comprising 1–2 parts HF to 5–15 parts $HNO_3$ to 2–5 parts glacial acetic acid with negligible agitation of said semiconductor body, said zones of said third region serving as masks, and thereby causing said zones of said third region and said fourth and second regions beneath them to further define said plurality of mesas;

i. providing a second heating of said semiconductor body in a nitrogen atmosphere at a temperature in the range from 895°C to 905°C for a duration of 15 ±5 minutes;

j. providing a second cooling of said semiconductor body in a nitrogen atmosphere at a temperature in the range from 400°C to 450°C for a duration of 3 ± 1 minutes, followed by an air quench at room temperature;

k. removing a third portion of said second region down to the upper surface of said first region in the space between said zones of said third region by etching with a fluid comprising 1–2 parts HF to 5–15 parts glacial acetic acid with negligible agitation of said semiconductor body, said zones of said third region serving as masks, and thereby causing said zones of said third region and said fourth and second regions beneath them to further define said plurality of mesas;

l. removing those portions of said zones of said third region which extend beyond the edges of said fourth and said second regions by exposing said semiconductor body to ultra-sonic vibration;

m. passivating the top surface of said semiconductor body, including the exposed surfaces of said first, second, third and fourth regions by reactively sputtering three layers of passivating material thereon;

n. centrifugally depositing over said third layer of passivating material a layer of glass from out of a colloidal solution of powdered glass, said layer of glass being fused to said third layer of passivating material by heating at a temperature of approximately 550°C;

o. exposing a portion of the top surface of each of said zones of said third region by removing a portion of each of said layers of passivating material and a portion of said layer of glass directly above said top surfaces of said zones by masking and etching with a HF-glycol solution;

p. providing electrically conducting terminals in contact with said top surfaces of said zones of said third region by first evaporating a layer of an electrically conducting metal onto said top surfaces and onto said layer of glass, followed by the etching away of substantially all of said layer of metal not directly above said top surfaces;

q. annealing said semiconductor body in a nitrogen atmosphere at a temperature in the range from 598°C to 602°C for a duration of 5 ± ½ minutes, followed by cooling in a nitrogen atmosphere at a temperature of from 400°C to 450°C for a duration of 5 ± 2 minutes and an air quench at room temperature;

r. depositing an electrically conducting material onto the bottom surface of said first region; and s. dicing said semiconductor body to form separate varactors, each of said varactors having at least one of said mesas.

* * * * *